US009797958B2

(12) United States Patent
Albrecht

(10) Patent No.: US 9,797,958 B2
(45) Date of Patent: Oct. 24, 2017

(54) MONITORING SYSTEM

(71) Applicant: Micronas GmbH, Freiburg (DE)

(72) Inventor: Stefan Albrecht, Mauchenheim (DE)

(73) Assignee: TDK-Micronas GmbH, Freiburg (DE)

( * ) Notice: Subject to any disclaimer, the term of this patent is extended or adjusted under 35 U.S.C. 154(b) by 470 days.

(21) Appl. No.: 14/333,059

(22) Filed: Jul. 16, 2014

(65) Prior Publication Data

US 2015/0022214 A1   Jan. 22, 2015

(30) Foreign Application Priority Data

Jul. 16, 2013 (DE) .................. 10 2013 011 790

(51) Int. Cl.
*G01R 31/36* (2006.01)
*G01R 31/02* (2006.01)

(52) U.S. Cl.
CPC ....... *G01R 31/3624* (2013.01); *G01R 31/021* (2013.01); *G01R 31/3606* (2013.01); *G01R 31/3658* (2013.01); *G01R 31/3662* (2013.01)

(58) Field of Classification Search
CPC .................................. G01R 31/3624
USPC .................................. 324/430, 126
See application file for complete search history.

(56) References Cited

U.S. PATENT DOCUMENTS

| 4,175,253 A | 11/1979 | Pitegoff | |
| 4,277,749 A | 7/1981 | Traub | |
| 5,376,891 A * | 12/1994 | Kirchlechner | H03D 1/22 327/156 |
| 5,804,979 A * | 9/1998 | Lund | G01R 1/203 324/126 |
| 6,285,191 B1 | 9/2001 | Gollomp et al. | |
| 6,522,123 B2 * | 2/2003 | Ribes | G01R 19/00 324/126 |
| 6,768,322 B2 | 7/2004 | Trümpler et al. | |
| 2005/0151543 A1 | 7/2005 | Taylor | |
| 2007/0139032 A1 * | 6/2007 | Dupuis | G01R 15/181 324/140 R |

(Continued)

FOREIGN PATENT DOCUMENTS

| DE | 100 13 345 A1 | 10/2001 |
| EP | 0 206 488 A1 | 12/1986 |

(Continued)

*Primary Examiner* — Yalkew Fantu
*Assistant Examiner* — Harry O'Neill-Becerril
(74) *Attorney, Agent, or Firm* — Muncy, Geissler, Olds & Lowe, P.C.

(57) ABSTRACT

A monitoring system having a monitoring unit and a circuit element that are integrated in an enclosure for protecting connections between the monitoring unit and the circuit element. The monitoring unit monitors the circuit element via a first electrical quantity, and the monitoring unit has a control unit and a first circuit unit and a second circuit unit. The first current is essentially or precisely equal in amplitude to the first current, and the first current and the second current flow simultaneously in the two line sections. The first current direction is opposite to the second current direction, and the first circuit unit ascertains a first voltage drop at the first line section, and the second circuit unit ascertains a second voltage drop at the second line section. The control unit ascertains the first electrical quantity from the first voltage drop and the second voltage drop.

15 Claims, 6 Drawing Sheets

(56) References Cited

U.S. PATENT DOCUMENTS

| | | | | |
|---|---|---|---|---|
| 2010/0060295 A1* | 3/2010 | Ishikawa | ............ | G01R 31/3624 |
| | | | | 324/601 |
| 2012/0201289 A1* | 8/2012 | Abdalla | .............. | H04L 25/0272 |
| | | | | 375/233 |
| 2014/0354308 A1* | 12/2014 | Hong | ........................ | G01K 7/22 |
| | | | | 324/713 |

FOREIGN PATENT DOCUMENTS

| EP | EP 0206488 A1 * | 12/1986 | ............. G01R 1/203 |
|---|---|---|---|
| WO | WO 97/11361 A1 | 3/1997 | |

\* cited by examiner

MONITORING SYSTEM

This nonprovisional application claims priority under 35 U.S.C. §119(a) to German Patent Application No. 10 2013 011 790.9, which was filed in Germany on Jul. 16, 2013, and which is herein incorporated by reference.

BACKGROUND OF THE INVENTION

Field of the Invention

The invention relates to a monitoring system.

Description of the Background Art

Known from EP 0 206 488 A1 and U.S. Pat. No. 6,285, 191 B1 are measurement devices for monitoring currents, in particular of batteries in automobiles. In addition, measurement devices of the generic type are also known from U.S. Pat. No. 6,522,123 B2 and US 2005/0 151 543 A1, U.S. Pat. No. 4,277,749, DE 100 13 345 A1 (which corresponds to, U.S. Pat. No. 6,768,322) and U.S. Pat. No. 6,285,191 B1.

According to the disclosure of U.S. Pat. No. 6,285,191 B1, the current of a ground line is monitored by the means that, in a first alternative, the current is ascertained from the measured voltage drop in the ground cable and the known resistance of the ground line based on Ohm's law. According to a second alternative, the current in the ground cable is ascertained for an unknown resistance of the ground cable by means of a self-calibrating instrumentation amplifier from the voltage drop. Calibration is carried out using a precision resistor and a precision current source. Moreover, the voltage drop in the ground cable is conducted to an input of the instrumentation amplifier by means of an adjustable voltage divider. The voltage divider must likewise be calibrated. The current in the ground cable is calculated from the comparison of the voltage drop at the precision resistor from the output of the instrumentation amplifier and the current source.

EP 0 206 488 A1 discloses measuring the voltage drop in a line through which current passes, in particular in a ground cable, by means of a Kelvin measurement circuit. The amplitude of the current in the line is determined from the voltage drop. To carry out the measurement, in a first step, a constant current source is connected to the line by means of the Kelvin measurement circuit in order to calibrate a measurement instrument with a known current from the current source. Under operating conditions, i.e., when current from a battery flows through the ground cable, or in more general terms the line, the amplitude of the current in the ground cable is ascertained from the measured voltage drop in the ground cable by means of the previously calibrated measurement instrument.

SUMMARY OF THE INVENTION

It is therefore an object of the invention to provide a monitoring system that advances the state of the art.

According to an embodiment of the invention, a monitoring system is provided having a monitoring unit and a circuit element to be monitored by means of the monitoring unit, wherein the monitoring unit and the circuit element are integrated in a shared enclosure for protecting the electrical connections between the monitoring unit and the circuit element, and the monitoring unit monitors the circuit element with the aid of a first electrical quantity, and wherein the monitoring unit has a control unit and a first circuit unit and a second circuit unit, and wherein the control unit and the first circuit unit and the second circuit unit are monolithically integrated on a semiconductor component, and the first circuit unit is connected to a first line section at a first connection point and at a second connection point spaced apart from the first connection point in a first line direction, and the second circuit unit is connected to a second line section at the second connection point and at a third connection point spaced apart from the second connection point further in the first line direction, and wherein a first current with a first current direction can be impressed on the first line section by means of the first circuit unit, and wherein a second current with a second current direction can be impressed on the second line section by means of the second circuit unit, and wherein the first current is essentially or precisely equal in amplitude to the second current, and the first current and the second current flow simultaneously in the two line sections, and wherein the first current direction is chosen to be opposite to the second current direction, and the first circuit unit ascertains a first voltage drop at the first line section, and the second circuit unit ascertains a second voltage drop at the second line section, and the control unit ascertains the first electrical quantity from the first voltage drop and the second voltage drop.

In an embodiment, the first electrical quantity is an actual current flowing through the two line sections, or is the internal resistance of a battery cell or the line resistance of the first line section and of the second line section.

An advantage of the monitoring system with a monitoring unit is that during normal operation of a circuit unit, for example an electrical device or a battery or a line, the current in a line of the device, in particular in the case of a ground line of an electrical load or of a battery cell, can be sensed without opening the line to be monitored, and in particular without interposing a cost-intensive so-called shunt resistor and even without knowledge of the line resistance—the first electrical quantity—of the circuit element to be monitored. Moreover, standardization, i.e., calibration, of the voltage measurement instrument before a measurement is also rendered unnecessary, depending on the embodiment. Also, no voltage divider is required between the voltage measurement instrument and the connection point in order to ascertain the voltage at a line section. Investigations have shown that impressing the first current and the second current during ongoing operation causes no impairment to the ongoing operation of the device, since the two impressed currents are opposite and equal in amplitude and no differential current is fed into the circuit unit being monitored. It is advantageous when the amplitude of the first current is in general chosen to be smaller than the actual current. Because even very low voltage values below 100 mV can be measured precisely, the method is also suitable for a low line resistance of a line section of less than 0.1 ohms. Furthermore, by means of the precise measurement of low voltages, the method can in particular be used for monitoring lines with currents having a high amplitude, preferably above 100 mA, most preferably above 1 A.

It is a matter of course that in accordance with Ohm's law the resistance of the line section of the circuit element can be determined from a single measurement using a known current amplitude and the measured voltage if no actual current is impressed. However, investigations have shown that the accuracy of measurement of the resistance, especially of ground cables, is completely unsatisfactory because of the very low line resistance, among other reasons. Furthermore, the resistance of the line sections depends on the age of the line and environmental influences such as humidity and temperature, and in some cases is nonlinear in certain ranges of current amplitude. As a result, resistance measurements on lines through which no current is flowing provide only inaccurate results, especially when the measurements were performed a relatively long time ago. In contrast thereto, the monitoring system according to the invention achieves a significantly more accurate sensing of the current amplitude or of the internal resistance of battery cells under real operating conditions. It should be noted that the control unit is configured to ascertain the amplitude of the actual current by means of the value of the voltage in a first state in which a first switch disconnects the first current source from the first connection point and a second switch disconnects the second current source from the second connection point, wherein only the actual current flows as a result, and in a second state the first switch connects the first current source to the first connection point and the second switch connects the second current source to the second connection point and in the second state the first current and the second current are impressed in addition to the actual current. The first switch and the second switch each have a control input connected to the control unit. In this way, it is possible to switch between the two states by means of the control unit. From the measurement of the first voltage drop and of the second voltage drop in the two states and the amplitude of the first current or second current, the amplitude of the actual current can be ascertained without calculating the line resistance of the first and second line sections. Stated differently, the control unit is configured to ascertain the amplitude of the actual current by means of the value of the first voltage drop and the value of the second voltage drop in a first state in which only the actual current flows between the first connection point and the third connection point, and by means of the value of the first voltage drop and the value of the second voltage drop in a second state in which the actual current and the first current and the second current flow between the first connection point and the third connection point.

In another embodiment, the control unit can be configured to ascertain the amplitude of the actual current without calculation or knowledge of the resistance of the first line section and/or of the resistance of the second line section.

In an embodiment, the circuit element can be implemented as an electrical line, wherein the monitoring unit is integrated into the enclosure of the electrical line, or the circuit element is a battery and the monitoring unit is integrated into the housing of the battery, or the circuit element is a stack of individual batteries and the monitoring unit is integrated into the enclosure of the battery stack. It is preferred for the monitoring unit to have additional terminals for the supply of electric power and/or for data exchange. In addition, it is preferred for the monitoring unit to draw its electric power supply from the circuit element.

In another embodiment, a multi-pole switch is inserted between the circuit element and the monitoring unit. In this design, it is preferred to successively monitor a plurality of series-connected battery cells by means of the monitoring unit and by means of the multi-pole switch. Especially in electromobility applications, it is advantageous that both the current between the cells and the internal resistance of the individual cells can be monitored.

In an embodiment, the monitoring unit has a calibration mode, wherein if the total voltage ascertained between the first connection point and the second connection point is nonzero, the first circuit unit and/or the second circuit unit preferably are trimmed by the monitoring unit, preferably by means of the control unit, in the calibration mode.

In an embodiment, the first current can be provided by a first current source that is integrated in the first circuit unit and is connected to the control unit, and in addition the second current is provided by a second current source that is integrated in the second circuit unit and is connected to the control unit, wherein the first current and the second current are a direct current or an alternating current. Especially in the case of direct current, it is advantageous to integrate a phase-sensitive rectifier, which is also referred to as a lock-in amplifier, into the control unit and to ascertain the amplitude of the actual current by means of the phase-sensitive rectifier. To this end, the typically very small voltages, which often have a substantial noise component, are integrated at a certain predetermined frequency and phase. By this means, the amplitude of the actual current can be reliably ascertained even for small voltages, preferably below 0.1 V, most preferably below 1 mV. Of course, it is preferred in the case of an alternating current for the frequency of the first and second currents to be made different from the frequency of the actual current in order to make especially good use of the lock-in principle.

Investigations have shown that it is advantageous to slowly raise the direct current—the first current and the second current—to a first nominal amplitude when the two current sources are connected to the line sections and to slowly lower the two currents to zero before the two current sources are disconnected from the line sections.

In another embodiment, the first current source and a first H-bridge circuit can be implemented as part of a first circuit block, wherein the first current source is connected to the first line section by the first H-bridge circuit, and the first circuit unit has a first converter unit with a first differential amplifier for measuring the first voltage drop and a first analog-to-digital converter connected to the output of the first differential amplifier, and the first converter unit is connected to the first line section by means of a second H-bridge circuit, and the first converter unit and the second H-bridge circuit are implemented as part of a first circuit section, and the output of the first analog-to-digital converter and the two H-bridge circuits are each connected to the control unit, and wherein the second current source and a third H-bridge circuit are implemented as part of a second circuit block, wherein the second current source is connected to the second line section by the third H-bridge circuit, and the second circuit unit has a second converter unit with a second differential amplifier for measuring the second voltage drop and a second analog-to-digital converter connected to the output of the second differential amplifier, and the second converter unit is connected to the second line section by means of a fourth H-bridge circuit, and the second converter unit and the fourth H-bridge circuit are implemented as part of a second circuit section, and the output of the second analog-to-digital converter, the third H-bridge circuit, and the fourth H-bridge circuit are each connected to the control unit.

In an embodiment, the control unit includes a data interface, wherein digital data are exchanged by means of the data interface, and the digital data contain information on the quantity to be monitored.

In an embodiment, the first current source and the second current source each have a control input connected to the control unit. In this way, the first current source and the second current source can be switched both on and off by means of the control unit. Furthermore, the amplitude of the first current and the amplitude of the second current, and if applicable the frequency of the two currents in the embodiment with alternating current, can be set, and in particular regulated as well. The amplitude of the voltage differences between the measurements during the first and second states, among other things, can be used as the control input for regulating the first current source and the second current source.

In an enhancement, the control unit can have a third differential amplifier, wherein a first input of the third differential amplifier is connected to the output of the first differential amplifier and a second input of the third differential amplifier is connected to the output of the second differential amplifier, and the first differential amplifier and second differential amplifier and third differential amplifier form a multi-stage amplifier unit. An advantage is that a sum of the voltage differences measured at the first line section and the second line section is present at the output of the multi-stage amplifier unit.

Another especially advantageous application resides in the use of the monitoring unit for in-situ calibration of unknown current amplitudes in a line section, wherein the variation of the current amplitudes in the line section advantageously spans at least a factor of ten. In this way, line sections that have completely different current amplitudes can be monitored in a simple and reliable way.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
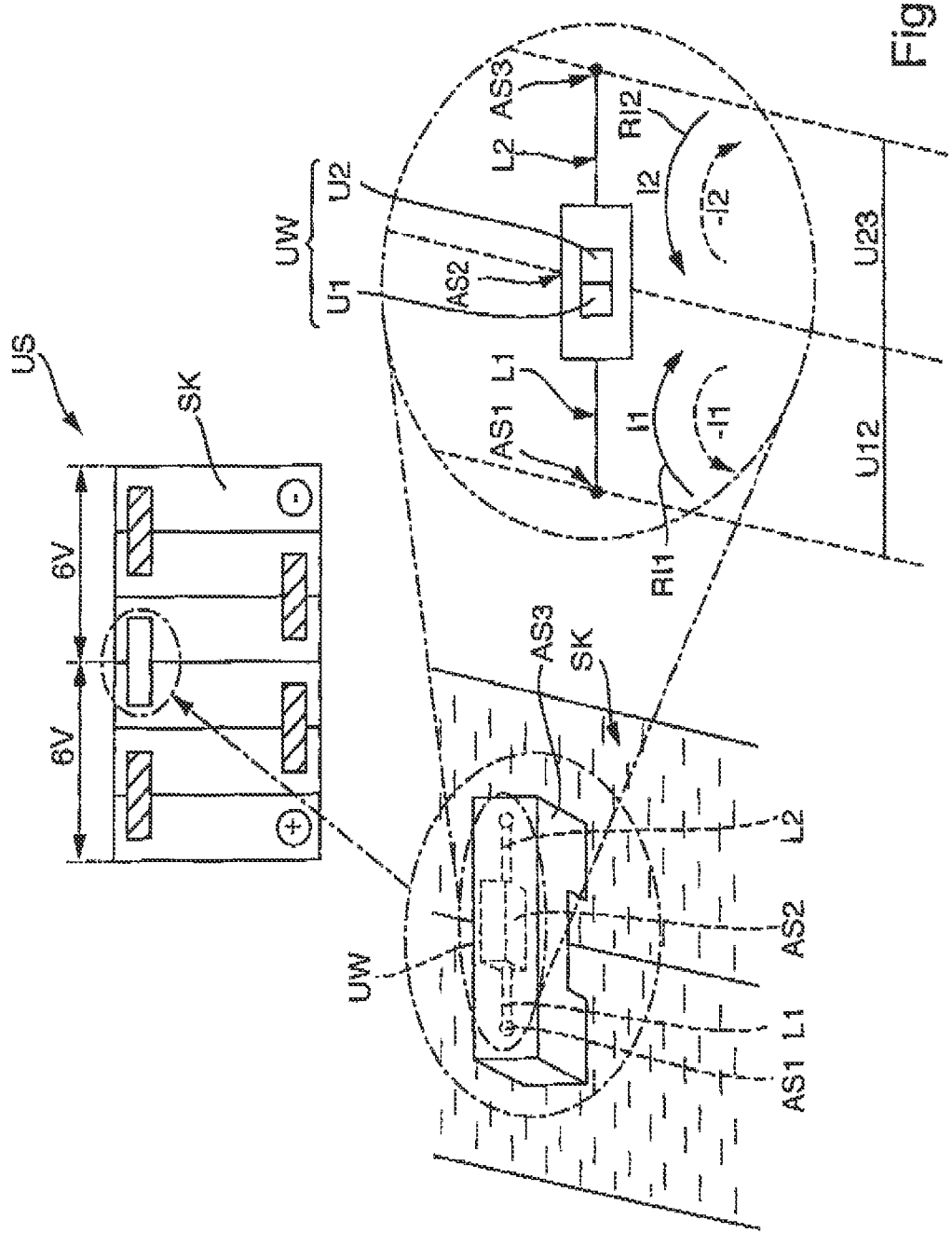
FIG. 1 shows an embodiment of the monitoring system with a battery as a circuit element.

The diagram in FIG. 1 shows a monitoring system (US) with a monitoring unit (UW) and a circuit element (SK) that is to be monitored by means of the monitoring unit (UW), wherein the monitoring unit (UW) and the circuit element (SK) are integrated in a shared enclosure for protecting the electrical connections between the monitoring unit (UW) and the circuit element (SK). In the present case, the circuit element (SK) is a battery, in particular a commercial 12 V motor vehicle battery. The monitoring system (US) is integrated into the battery housing, while the battery housing is not shown for reasons of clarity. It is preferred for the electrical power supply of the monitoring system (US) to be provided from the energy reserve of the battery, and for the monitoring system (US) to be read out by means of a data interface (DSI) that is not shown. In the present case, the circuit element (SK) is monitored by the monitoring unit (UW) on the basis of a first electrical quantity, wherein the monitoring unit (UW) has a control unit (ST), not shown, and a first circuit unit (U1) and a second circuit unit (U2), and wherein the control unit (ST) and the first circuit unit (U1) and the second circuit unit (U2) are monolithically integrated on a semiconductor component (HALB), not shown.

In the monitoring unit (UW), the first circuit unit (U1) is connected to a first line section (L1) at a first connection point (AS1) and at a second connection point (AS2) spaced apart from the first connection point (AS1) in a first line direction, and the second circuit unit (U2) is connected to a second line section (L2) at the second connection point (AS2) and at a third connection point (AS3) spaced apart from the second connection point (AS2) further in the first line direction, wherein a first current (I1) with a first current direction (R11) is impressed on the first line section (L1) by means of the first circuit unit (U1), and wherein a second current (I2) with a second current direction (R12) is impressed on the second line section (L2) by means of the second circuit unit (U2).

In the present case, the first current (I1) is set by the control unit to be essentially or precisely equal in amplitude to the second current (I2), wherein the first current (I1) and the second current (I2) flow simultaneously in the two line sections (L1, L2), and wherein the first current direction (R11) is chosen to be opposite to the second current direction (R12), and the first circuit unit (U1) ascertains a first voltage drop (U12) at the first line section (L1), and the second circuit unit (U2) ascertains a second voltage drop (U23) at the second line section (L2) simultaneously with the first circuit unit (U1). Subsequently, the control unit (ST) ascertains, from the first voltage drop (U12) and the second voltage drop (U23), an actual current (IST1) flowing through the strap, not shown, as the first electrical quantity.

Figure 2:
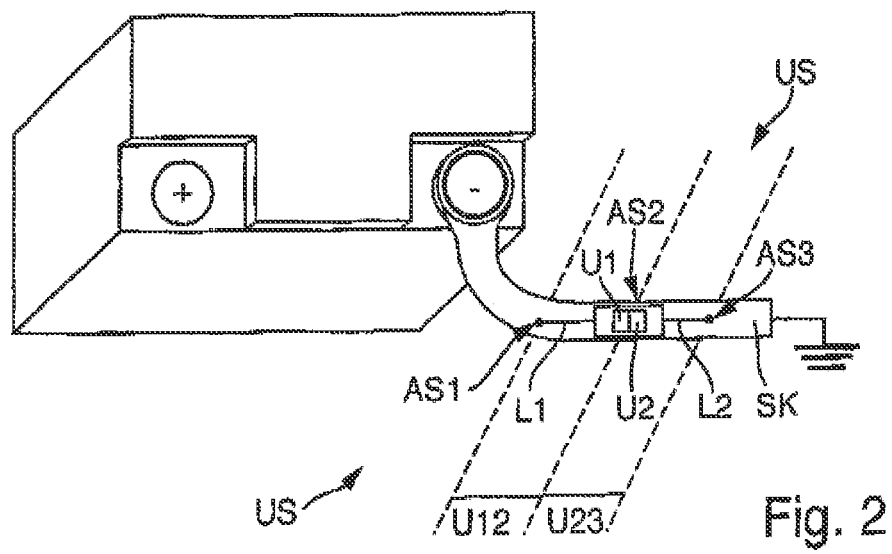
FIG. 2 shows an embodiment of the monitoring system with a cable as circuit element.

Shown in the illustration in FIG. 2 is a second embodiment of the monitoring system (US) with a ground cable of a motor vehicle battery as the circuit element (SK). Only the differences from the illustration in FIG. 1 are explained below. The monitoring element (UW) is arranged on the ground cable, and is electrically connected to the ground cable at least at the three connection points (AS1, AS2, AS3). In the present case, the monitoring system (US) is designed to ascertain the amplitude of an actual current (IST1) that is flowing. Alternatively, the resistance of the ground cable can also be determined. Together with the three connection points (AS1, AS2, AS3) and the ground cable, the monitoring element (UW) is integrated into an enclosure, not shown.

Figure 3:
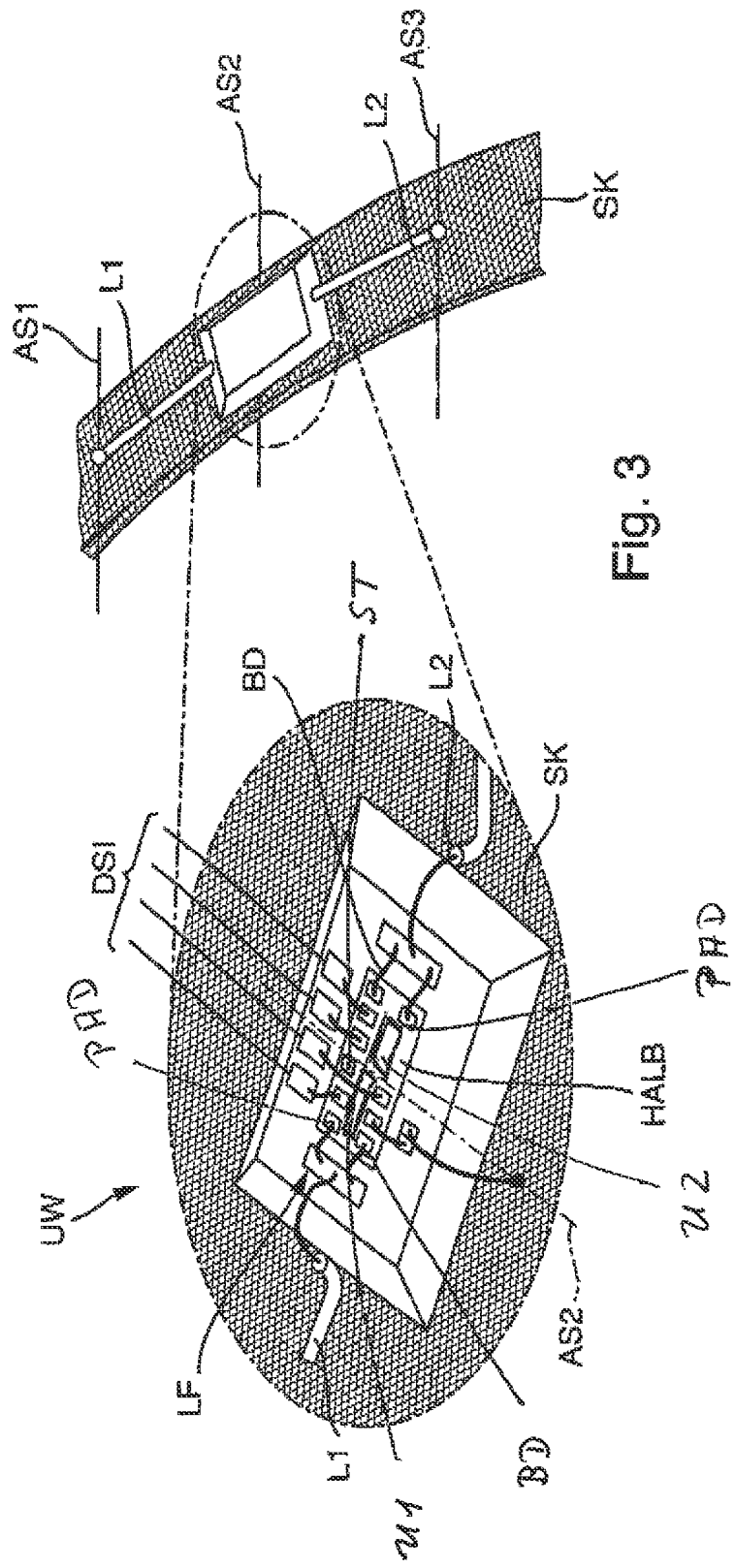
FIG. 3 shows an enlarged representation of the embodiment shown in FIG. 2.

The illustration in FIG. 3 shows an enlarged representation of the embodiment shown in FIG. 2. Only the differences from the preceding figures are explained below. In the enlarged representation in FIG. 3, an IC housing is shown opened. It is evident that the semiconductor body (HALB) is implemented as the support for the control unit (ST) and the first circuit unit (U1) and the second circuit unit (U2) monolithically integrated on the semiconductor body (HALB). The semiconductor body (HALB) is arranged on a lead frame (metal support) (LF) and has a number of bonding areas (PAD) on the surface. The bonding areas (PAD) are connected by means of bond wires (BD) to connection areas of the lead frame (LF) (metal support). In addition, the control unit (ST) includes a data interface (DSI), wherein digital data are exchanged by means of the data interface (DSI), and the digital data contain information on the quantity to be monitored of the ground cable.

Figure 4:
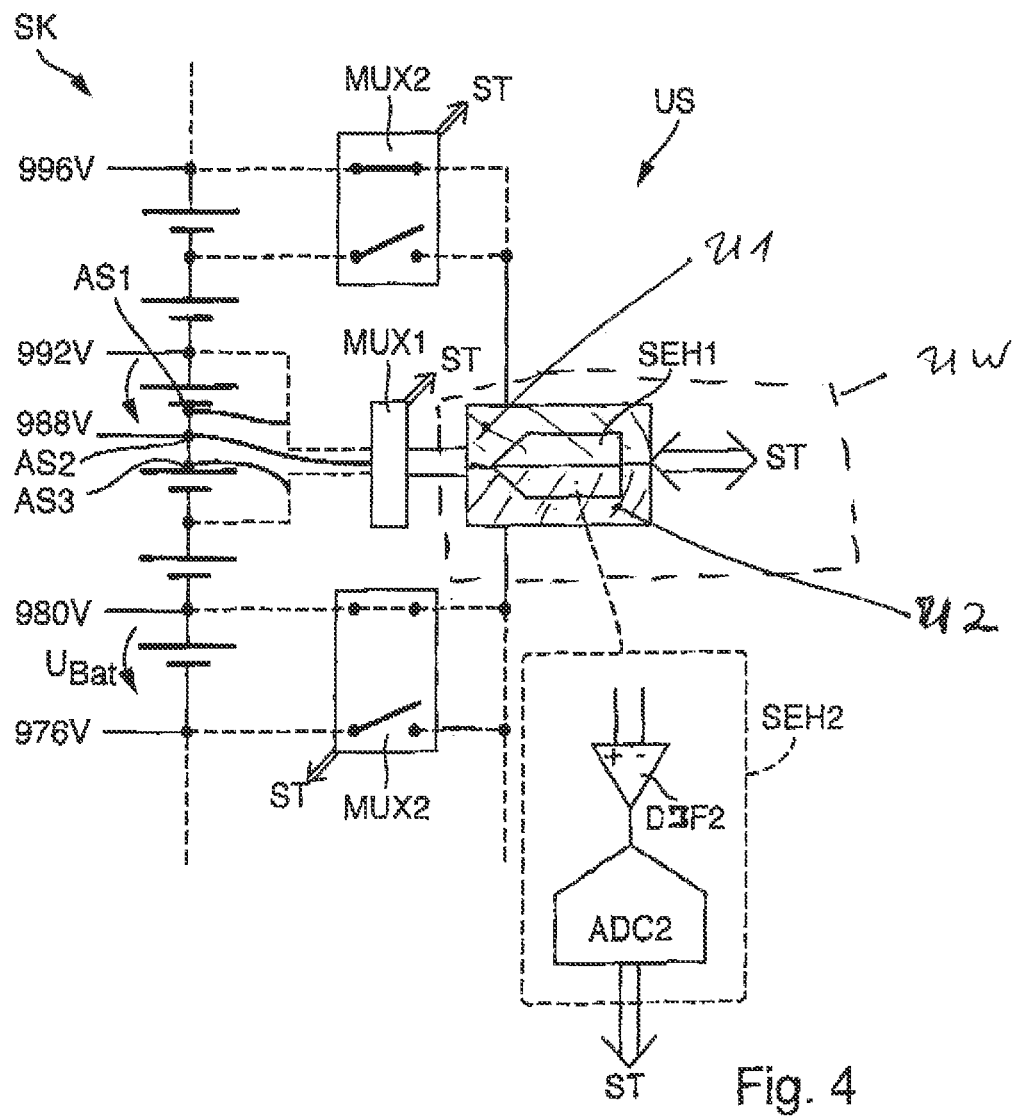
FIG. 4 shows a fourth embodiment of the monitoring system with a battery stack as a circuit element.

The illustration in FIG. 4 shows a fourth embodiment of the monitoring system (US) with a battery stack as a circuit element (SK). Only the differences from the preceding figures are explained below. In the present case, the circuit element (SK) comprises a stack of a plurality of individual batteries, wherein each cell has a voltage of 4 volts. The monitoring unit (UW) is integrated in the enclosure of the battery stack—not shown. Inserted between the terminals of the monitoring unit (UW) are a first multi-pole switch (MUX1) and a second multi-pole switch (MUX2). A plurality of series-connected battery cells can be successively monitored by the monitoring unit (UW) by means of the first multi-pole switch (MUX1), wherein the terminals for electrical energy supply of the monitoring unit (UW) are switched over by means of the second multi-pole switch (MUX2). In this way, the monitoring unit (UW) can easily and economically be used at a high voltage. Both multi-pole switches (MUX1 and MUX2) are connected to the control unit (ST). In addition, the first circuit unit (U1) comprises a first circuit section SEH1 and the second circuit unit (U2) comprises a second circuit section SEH2; with regard to the structure of the two circuit sections SEH1 and SEH2 reference is made to the description below.

Figure 5:
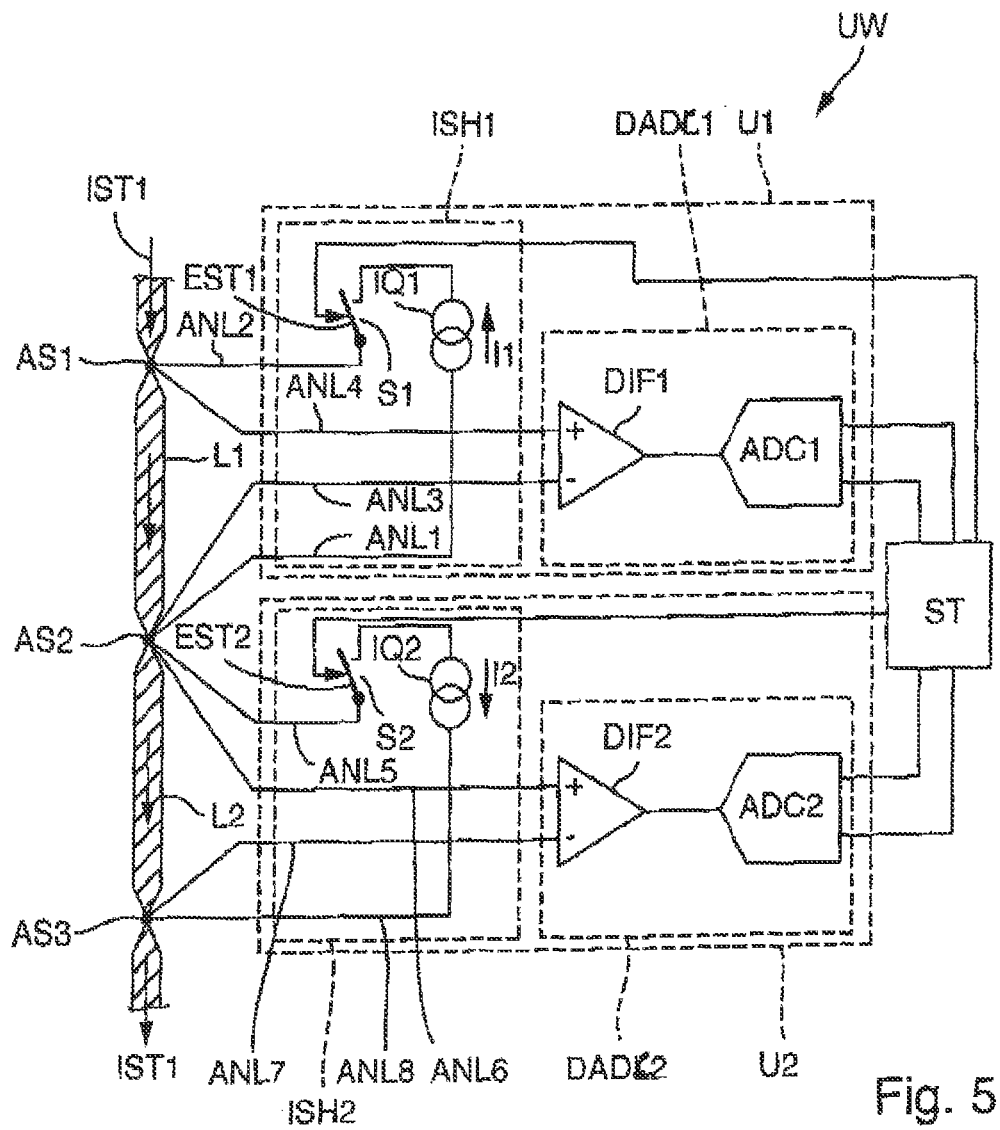
FIG. 5 shows an embodiment of the monitoring unit.

In the diagram in FIG. 5, a first embodiment of the monitoring unit UW is shown in more detail. Only the differences from the preceding figures are explained below. In addition to the control unit ST, the monitoring unit UW has the first circuit unit (U1) and the second circuit unit (U2). The first circuit unit (U1) has a first circuit arrangement DADC1 with a first analog-to-digital converter ADC1, and a first differential amplifier DIF1. In addition, the second circuit unit (U2) has a second circuit arrangement DADC2 with a second analog-to-digital converter ADC2, and a second differential amplifier DIF2.

In addition, the monitoring unit UW includes a first circuit block ISH1 with a first current source IQ1. The first current source IQ1 is connected to a first connecting line ANL1 with the first connection point AS1, and to a second connecting line ANL2 with the second connection point AS2. The first current source IQ1 outputs the first current I1. In addition, a first switch S1 with a control input EST1 is provided, wherein the first switch S1 is inserted in the first connecting line ANL1 and connects or disconnects the first current source IQ1 to or from the first connection point AS1.

In addition, the monitoring unit UW includes a second circuit block ISH2 with a second current source IQ2. The second current source IQ2 is connected to a fifth connecting line ANL5 with the second connection point AS2, and to an eighth connecting line ANL8 with the third connection point AS3. The second current source IQ2 outputs the second current I2. In addition, a second switch S2 with a control input EST2 is provided, wherein the second switch S2 is inserted in the fifth connecting line ANL5 and connects or disconnects the second current source IQ2 to or from the second connection point AS2.

The first differential amplifier DIF1 has a first input, a second input, and an output, wherein the first input is implemented as an inverting input and is connected to a third connecting line ANL3 with the first connection point AS1, and the second input is implemented as a non-inverting input and is connected to a fourth connecting line ANL4 with the second connection point AS2. The output of the first differential amplifier DIF1 is connected to an input of the first analog-to-digital converter ADC1. The first analog-to-digital converter ADC1 has an output connected to the control unit ST. Consequently, the first analog-to-digital converter ADC1 is inserted between the output of the first differential amplifier DIF1 and the control unit ST. In addition, the control unit ST is connected to the control input EST1 of the first switch S1.

The second differential amplifier DIF2 has a first input, a second input, and an output, wherein the first input is implemented as an inverting input and is connected to an eighth connecting line ANL8 with the third connection point AS3, and the second input is implemented as a non-inverting input and is connected to a seventh connecting line ANL7 with the second connection point AS2. The output of the second differential amplifier DIF2 is connected to an input of the second analog-to-digital converter ADC2. The second analog-to-digital converter ADC2 has an output connected to the control unit ST. Consequently, the second analog-to-digital converter ADC2 is inserted between the output of the second differential amplifier DIF2 and the control unit ST. In addition, the control unit ST is connected to the control input EST2 of the second switch S2.

An actual current IST1 flows in the first line section L1 and in the second line section, which is to say that a device that is not shown is operated and is drawing current. In the second state, the first switch S1 is closed and the first current I1 is impressed on the first line section L1 in addition to the actual current IST1. As a result, a first voltage U1 is present between the first input and the second input of the first differential amplifier DIR. The first voltage U1 is determined by the amplitude of the first actual current IST1 and the amplitude of the first current I1 and the non-negligible line resistance of the first line section L1. In a first state, the first switch S1 is open and a second voltage U2 determined exclusively by the actual current IST1 is present between the first input and the second input of the first differential amplifier DIF1. It is a matter of course that the second voltage U2 is different from the first voltage U1. If the first current I1 has the same technical current direction as the actual current IST1, then the first voltage U1 is greater than the second voltage U2. Conversely, the second voltage U2 is greater than the first voltage U1 if the technical current directions are different. It is a matter of course that the absolute value of the first voltage U1 and the second voltage U2 are always meant here. Furthermore, it should be noted that the amplitude of the first current I1 is in general chosen to be smaller than the amplitude of the actual current IST1. Corresponding remarks also apply to the second circuit unit U2.

Figure 6:
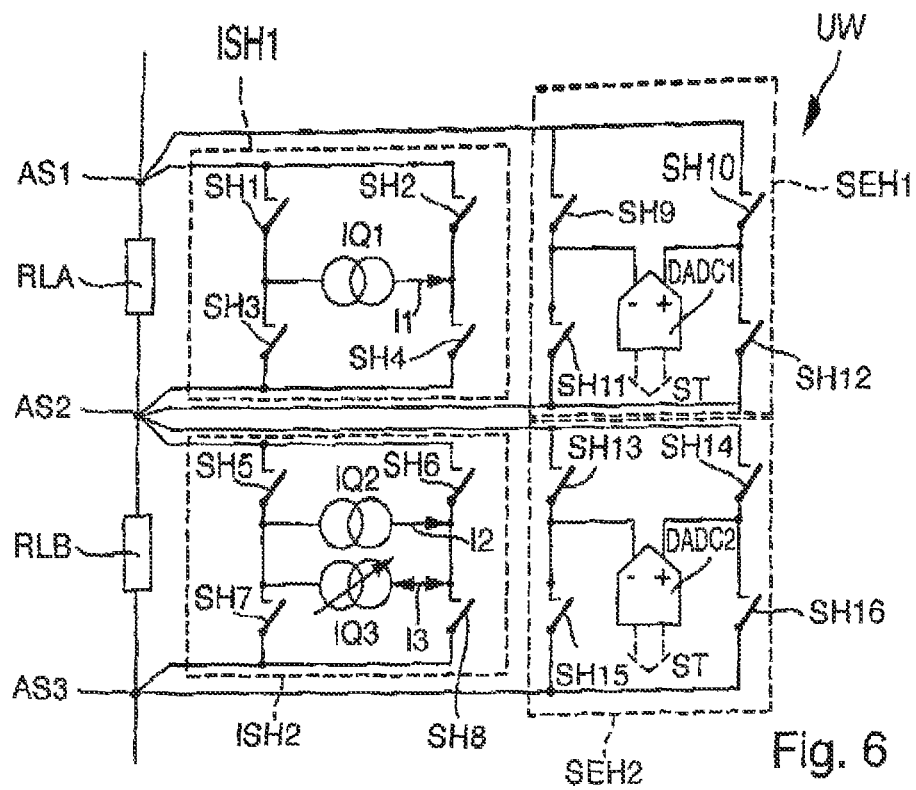
FIG. 6 shows an embodiment of the monitoring unit.

Another especially advantageous embodiment of the monitoring device UW is shown in the diagram in FIG. 6. For reasons of clarity, only parts of the monitoring device UW are shown in the present equivalent circuit diagram in this case. Only the differences from one of the preceding figures are explained below. The two line sections L1 and L2 are represented by means of the associated equivalent resistances RLA and RLB. A third adjustable current source IQ3 is provided in parallel with the second current source IQ2. The control input of the third current source IQ3 is connected—not shown—to the control unit ST. By means of the third current source IQ3 with a third current I3, the summed value of the two currents I2 and I3 can be set exactly equal to the value of the first current I1 in a simple manner.

Furthermore, the first circuit arrangement DADC1 is connected to the first line section L1 by means of the H-bridge circuits SH9 to SH12, and the second circuit arrangement DADC2 is connected to the second line section L2 by means of the H-bridge circuits SH13 to SH16. Moreover, the first current source IQ1 is connected to the first line section L1 by the H-bridge circuits SH1 to SH4, and the second current source IQ2 is connected to the second line section L2 by the H-bridge circuits SH5 to SH8. For reasons of clarity, the associated control inputs of all bridge circuits are not shown. For reasons of clarity, the associated control inputs of all bridge circuits are not shown.

Because each of the current sources IQ1 to IQ3, and each of the circuit arrangements DADC1 to DADC3 as well, is connected to the associated line sections by an H-bridge, the result is great flexibility with regard to measurement of the voltage values at the first line section L1 and at the second line section L2 and in the combination of the individual measured voltage values.

Figure 7:
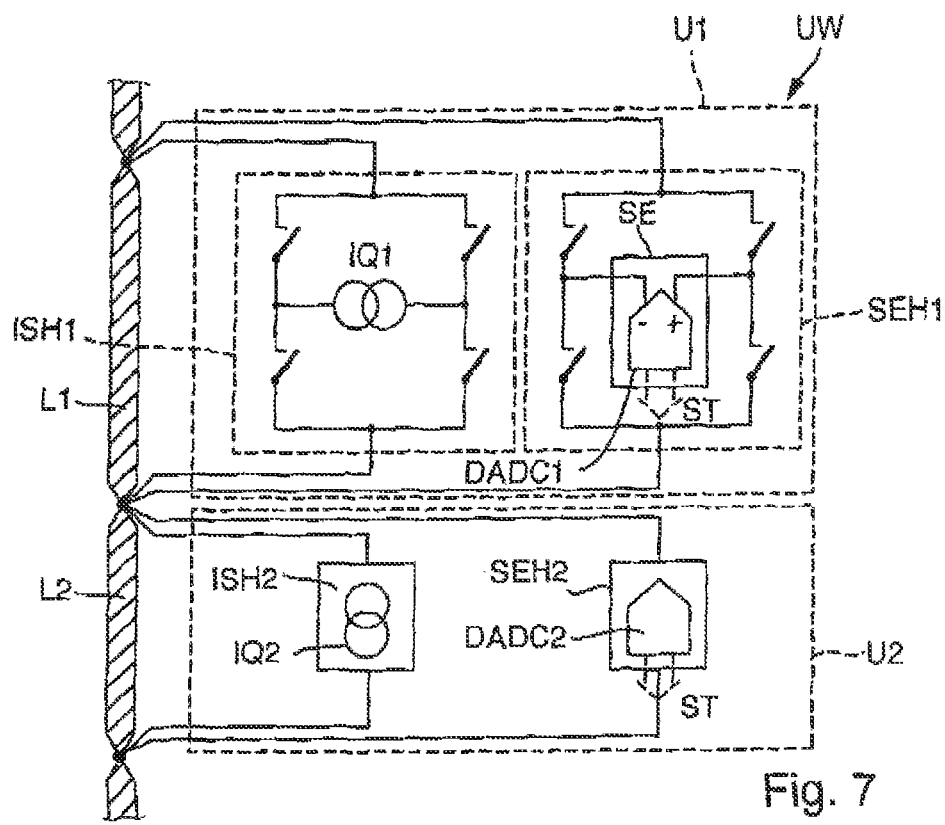
FIG. 7 shows an embodiment of the monitoring unit.

FIG. 7 shows a greatly simplified equivalent circuit diagram of a part of the monitoring device UW according to the embodiment shown in FIG. 6. Only the differences from one of the preceding figures are explained below. The H-bridge with the connected first current source IQ1 is aggregated into a first circuit block ISH1. Moreover, the H-bridge with the connected second current source IQ2 is aggregated into a second circuit block ISH2. The H-bridge with the connected first circuit arrangement DADC1 is aggregated into a first circuit section SEH1, and the H-bridge with the connected second circuit arrangement DADC2 is aggregated into a second circuit section SEH2. The first circuit block ISH1, second circuit block ISH2, first circuit section SEH1, and second circuit section SEH2 are aggregated into the first circuit unit U1 or into the second circuit unit U2.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A monitoring system comprising:
a monitoring unit; and
a circuit element to be monitored via the monitoring unit, the monitoring unit and the circuit element being integrated in a shared enclosure for protecting electrical connections between the monitoring unit and the circuit element,
wherein the monitoring unit monitors the circuit element via a first electrical quantity,
wherein the monitoring unit has a control unit and a first circuit unit and a second circuit unit,
wherein the control unit and the first circuit unit and the second circuit unit are monolithically integrated on a semiconductor component,
wherein the first circuit unit is connected to a first line section at a first connection point and at a second connection point spaced apart from the first connection point in a first line direction,
wherein the second circuit unit is connected to a second line section at the second connection point and at a third connection point spaced apart from the second connection point in the first line direction,
wherein a first current with a first current direction is provided on the first line section via a first current source of the first circuit unit,
wherein a second current with a second current direction is provided on the second line section via a second current source of the second circuit unit,
wherein the first current is essentially or precisely equal in amplitude to the second current,
wherein, during operation, the first current and the second current flow through the first line section and the second line section concurrently,
wherein the first current direction is along the first line section and opposite to the second current direction along the second line section,
wherein the first circuit unit ascertains a first voltage drop at the first line section,
wherein the second circuit unit ascertains a second voltage drop at the second line section, and
wherein the control unit ascertains the first electrical quantity from the first voltage drop and the second voltage drop.

2. The monitoring system according to claim 1, wherein the first electrical quantity is an actual current flowing through the two line sections or is an internal resistance of a battery cell or a line resistance of the first line section and of the second line section.

3. The monitoring system according to claim 1, wherein the circuit element is an electrical line, and wherein the monitoring unit is integrated into the enclosure of the electrical line, or wherein the circuit element is a battery and the monitoring unit is integrated into the housing of the battery, or wherein the circuit element is a stack of individual batteries and the monitoring unit is integrated into the enclosure of the battery stack.

4. The monitoring system according to claim 1, wherein the monitoring unit has additional terminals for the supply of electric power and/or for data exchange.

5. The monitoring system according to claim 1, wherein the monitoring unit draws electric power supply from the circuit element.

6. The monitoring system according to claim 1, wherein a multi-pole switch is inserted between the circuit element and the monitoring unit.

7. The monitoring system according to claim 6, wherein the monitoring unit successively monitors a plurality of series-connected battery cells via the multi-pole switch.

8. The monitoring system according to claim 1, wherein the monitoring unit has a calibration mode and, if a total voltage ascertained between the first connection point and the second connection point is nonzero, the first circuit unit and/or the second circuit unit are trimmed in a calibration mode.

9. The monitoring system according to claim 2, wherein the control unit contains a phase-sensitive rectifier and the amplitude of an actual current is ascertained by the phase-sensitive rectifier.

10. The monitoring system according to claim 1, wherein the first current is provided by a first current source that is integrated in the first circuit unit and is connected to the control unit, and wherein the second current is provided by a second current source that is integrated in the second circuit unit and is connected to the control unit, and wherein the first current and the second current are a direct current or an alternating current.

11. The monitoring system according to claim 10, wherein the first current source and a first H-bridge circuit are a part of a first circuit block, wherein the first current source is connected to the first line section by the first H-bridge circuit, wherein the first circuit unit has a first converter unit with a first differential amplifier for measuring the first voltage drop and a first analog-to-digital converter connected to the output of the first differential amplifier, wherein the first converter unit is connected to the first line section by a second H-bridge circuit, wherein the first converter unit and the second H-bridge circuit are a part of a first circuit section, wherein an output of the first analog-to-digital converter and the two H-bridge circuits are each connected to the control unit, wherein the second current source and a third H-bridge circuit are a part of a second circuit block, wherein the second current source is connected to the second line section by the third H-bridge circuit, wherein the second circuit unit has a second converter unit with a second differential amplifier for measuring the second voltage drop and a second analog-to-digital converter connected to the output of the second differential amplifier, wherein the second converter unit is connected to the second line section by a fourth H-bridge circuit, wherein the second converter unit and the fourth H-bridge circuit are a part of a second circuit section, and wherein the output of the second analog-to-digital converter, the third H-bridge circuit, and the fourth H-bridge circuit are each connected to the control unit.

12. The monitoring system according to claim 1, wherein the control unit ascertains an amplitude of the actual current by a value of the first voltage drop and a value of a second voltage drop in a first state in which only the actual current flows between the first connection point and the third connection point and via the value of the first voltage drop and the value of the second voltage drop in a second state in which the actual current and the first current and the second current flow between the first connection point and the third connection point.

13. The monitoring system according to claim 1, wherein the control unit is ascertains an amplitude of the actual current without calculation or knowledge of a resistance of the first line section and/or of a resistance of the second line section.

14. The monitoring system according to claim 1, wherein the control unit includes a data interface, and wherein digital data are exchanged via the data interface, and the digital data contains information on a quantity to be monitored.

15. The monitoring system according to claim 1, wherein the first current source and the second current source provide the first current and the second current as test currents in addition to a main current under test.

* * * * *